United States Patent
Becker

(10) Patent No.: US 6,915,251 B2
(45) Date of Patent: *Jul. 5, 2005

(54) MEMORIES HAVING REDUCED BITLINE VOLTAGE OFFSETS

(75) Inventor: Scott T. Becker, San Jose, CA (US)

(73) Assignee: Artisan Components, Inc., Sunnyvale, CA (US)

( * ) Notice: Subject to any disclaimer, the term of this patent is extended or adjusted under 35 U.S.C. 154(b) by 556 days.

This patent is subject to a terminal disclaimer.

(21) Appl. No.: 10/026,245

(22) Filed: Dec. 17, 2001

(65) Prior Publication Data

US 2002/0056071 A1 May 9, 2002

Related U.S. Application Data

(60) Continuation of application No. 09/442,877, filed on Nov. 18, 1999, which is a division of application No. 09/015,427, filed on Jan. 29, 1998, now Pat. No. 6,016,390.

(51) Int. Cl.[7] .............................................. G06F 17/50
(52) U.S. Cl. ............................ 703/14; 703/13; 703/15; 716/17; 365/233; 365/207; 365/222
(58) Field of Search .............................. 703/13, 14, 15; 716/17; 365/233, 207

(56) References Cited

U.S. PATENT DOCUMENTS

| | | | |
|---|---|---|---|
| 4,418,403 A | 11/1983 | O'Toole et al | 365/201 |
| 4,432,076 A | 2/1984 | Yamada et al. | 365/190 |
| 4,663,740 A | 5/1987 | Ebel | 365/185 |
| 4,694,425 A | 9/1987 | Imel | 365/49 |
| 4,791,613 A | 12/1988 | Hardee | 365/189 |
| 4,858,182 A | 8/1989 | Pang et al. | 365/156 |
| 4,873,664 A | 10/1989 | Eaton, Jr. | 365/145 |
| 4,894,804 A | 1/1990 | Uchida | 365/190 |
| 4,916,661 A | 4/1990 | Nawaki et al. | 365/51 |
| 4,984,201 A | 1/1991 | Sato et al. | 365/154 |
| 5,040,144 A | 8/1991 | Pelley et al. | 365/51 |
| 5,058,073 A | 10/1991 | Cho et al. | 365/205 |
| 5,065,363 A | 11/1991 | Sato et al. | 365/154 |
| 5,166,902 A | 11/1992 | Silver | 365/182 |
| 5,179,538 A * | 1/1993 | Pang et al. | 365/207 |
| 5,237,533 A | 8/1993 | Papaliolios | 365/207 |
| 5,253,209 A | 10/1993 | Hoffmann et al. | 365/201 |
| 5,258,946 A | 11/1993 | Graf | 365/49 |

(Continued)

FOREIGN PATENT DOCUMENTS

| | | | |
|---|---|---|---|
| JP | 1-112590 | 5/1989 | G11C/11/34 |
| JP | 1-133285 | 5/1989 | G11C/11/34 |
| JP | 4-349293 | 12/1992 | G11C/11/401 |
| JP | 4-372789 | 12/1992 | G11C/11/401 |
| JP | 6-28862 | 2/1994 | G11C/11/41 |
| JP | 6-251580 | 9/1994 | G11C/11/401 |

OTHER PUBLICATIONS

"Low–supply–noise low–power embedded modular SRAM", K.J. Schultz et al, IEEE Prceedings—Circuits Devices and Systems, vol. 143, No. 2, Apr. 1996.*

(Continued)

Primary Examiner—Jean R. Homere
Assistant Examiner—Fred Ferris
(74) Attorney, Agent, or Firm—Martine Penilla & Gencarella, LLP

(57) ABSTRACT

A memory device design is provided. The memory device includes a memory core having a depth that defines a plurality of words, and a word width that is defined by multiple pairs of a global bitline and a global complementary bitline. The memory device further includes a core cell having a bitline and a complementary bitline, and a flipped core cell that has a flipped bitline and a flipped complementary bitline. The multiple pairs of the global bitline and the global complementary bitline have a plurality of core cells that are defined by alternating ones of the core cell and the flipped core.

11 Claims, 10 Drawing Sheets

U.S. PATENT DOCUMENTS

| | | | | |
|---|---|---|---|---|
| 5,289,432 A | | 2/1994 | Dhong et al. | 365/230.05 |
| 5,297,089 A | | 3/1994 | Wong | 365/202 |
| 5,305,252 A | | 4/1994 | Saeki | 365/63 |
| 5,410,505 A | | 4/1995 | Furuyama | 365/189.05 |
| 5,434,821 A | | 7/1995 | Watanabe et al. | 365/203 |
| 5,475,638 A | | 12/1995 | Anami et al. | 365/189.11 |
| 5,487,029 A | | 1/1996 | Kuroda | 365/145 |
| 35,154 A | | 2/1996 | Hardee | 365/189.09 |
| 5,555,212 A | | 9/1996 | Toshiaki et al. | 365/200 |
| 5,581,126 A | | 12/1996 | Moench | 257/776 |
| 35,430 A | | 1/1997 | Yamada et al. | 365/189.01 |
| 5,644,525 A | | 7/1997 | Takashima et al. | 365/51 |
| 5,671,174 A | | 9/1997 | Koike et al. | 365/145 |
| 5,677,887 A | | 10/1997 | Ishibashi et al. | 365/205 |
| 5,729,492 A | | 3/1998 | Campardo | 365/185.21 |
| 5,745,402 A | | 4/1998 | Arase | 365/145 |
| 5,745,420 A | | 4/1998 | McClure | 365/201 |
| 5,748,547 A | * | 5/1998 | Shau | 365/222 |
| 5,754,488 A | | 5/1998 | Suh | 365/205 |
| 5,768,182 A | | 6/1998 | Hu et al. | 365/145 |
| 5,796,650 A | | 8/1998 | Wik et al. | 365/150 |
| 5,801,983 A | | 9/1998 | Saeki | 365/149 |
| 5,811,862 A | | 9/1998 | Okugaki et al. | 257/390 |
| 5,822,252 A | * | 10/1998 | Lee et al. | 365/185.3 |
| 5,862,092 A | | 1/1999 | Hawkins et al. | 365/221 |
| 5,877,976 A | | 3/1999 | Lattimore et al. | 365/63 |
| 5,917,754 A | | 6/1999 | Pathak et al. | 365/185.21 |
| 5,930,185 A | | 7/1999 | Wendell | 365/201 |
| 5,982,666 A | | 11/1999 | Campardo | 365/185.21 |
| 5,986,923 A | | 11/1999 | Zhang et al. | 365/154 |
| 5,999,482 A | * | 12/1999 | Kornachuk et al. | 365/233 |
| 6,016,390 A | * | 1/2000 | Mali et al. | 716/17 |
| 6,043,562 A | * | 3/2000 | Keeth | 257/776 |
| 6,072,732 A | | 6/2000 | McClure | 365/191 |
| 6,075,725 A | | 6/2000 | Choi et al. | 365/185.2 |
| 6,154,405 A | | 11/2000 | Takemae et al. | 365/210 |
| 6,288,969 B1 | * | 9/2001 | Gibbins et al. | 365/230.05 |
| 6,470,304 B1 | * | 10/2002 | Mali et al. | 703/14 |

OTHER PUBLICATIONS

Katsunori et al., "*9–ns 16–Mb CMOS SRAM with offset-compensated current sense amplifer*", Nov. 1993, p. 1119–1124, IEEE Journal of Solid–State Circuits, v. 28 n, Sony Corp., Japan.

Yamauchi et al., "*A 0.5 V/100 MHz over–V/sub CC/grounded data storage (OVGS) SRAM cell architecture with boosted bit–line and offset source over–driving schemes*", Aug. 1996, p. 49–54, IEEE Solid–State Circuits Council, New York, NY.

Watanabe et al., "*Offset compensating bit–line sensing scheme for high density DRAM's*", Jan. 1994, vol. 29, No. 1, p. 9–13, IEEE Journal of Solid–State Circuits, IBM Corp., NY.

Kraus et al., "*Optimized sensing scheme of DRAMs*", Aug. 1989, IEEE Journal of Solid–State Circuits, vol. 24, No. 4, p. 895–899, USA.

Chou et al., "*A 60–ns 16–Mbit DRAM with a Minimized Sensing Delay Caused by Bit–Line Stray Capacitance*", Oct. 1989, IEEE Journal of Solid–State Circuits, vol. 24, No. 5, p. 1176–1183, Japan.

Taylor et al., "*A 1Mb CMOS DRAM with A Divided Bitline Matrix Architecture*", Feb. 1985, IEEE International Solid-State Circuits Conf., Carrolton, TX.

Yoshihara et al., "*A Twisted Bit Line Technique for Multi–Mb DRAMs*", Feb. 1988, Mitsubishi LSI Research and Development Laboratory, Itami, Japan.

Taylor et al., "*A 1–Mbit CMOS Dynamic RAM with a Divided Bitline Matrix Architecture*", Oct. 1985, IEEE Journal of Solid–State Circuits, vol. Sc–20, No. 5, p. 894–902, Carrolton, TX.

* cited by examiner

MEMORIES HAVING REDUCED BITLINE VOLTAGE OFFSETS

CROSS-REFERENCE TO RELATED APPLICATIONS

This Application is a continuation of U.S. application Ser. No. 09/442,877, filed Nov. 18, 1999, which is a Divisional Application of Ser. No. 09/015,427 filed Jan. 29, 1998, now U.S. Pat. No. 6,016,390, each of which is herein incorporated by reference.

BACKGROUND OF THE INVENTION

1. Field of the Invention

The present invention relates generally to integrated circuits, and more particularly to memory devices and the optimized design and fabrication of memory devices.

2. Description of the Related Art

Semiconductor memory cores are typically laid-out in array format, such that each individual core cell is coupled by a wordline and a pair of differential bitlines. To read or write data from or to a selected core cell, associated memory accessing circuitry is commonly designed around a memory core. For example, several key memory access circuit components typically include addressing circuitry for selecting a core cell, wordline drivers for driving a selected wordline, sense amplifiers for amplifying the signals that are read from selected core cells and output buffers.

As computer manufactures continue to push for new limits in performance, memory devices will also be required to operate at improved performance levels. Therefore, both the design and the fabrication of memory devices should be fine tuned to eliminate known and expected delays and inefficiencies.

With this in mind, FIG. 1A shows a simplified diagram of a memory core 10 that has an array of core cells 12. Each of the core cells 12 are interconnected by a pair of bitlines, such as bitline (BL) 14 and a complimentary bitline (/BL) 16. Each core cell is also electrically interconnected with other core cells 12 along horizontal wordlines (WL) 18. As mentioned above, sense amplifying circuitry is usually implemented to read data, and write drivers to write data into selected core cells 12.

Although conventional sense amplifying circuitry has worked well in the past for sensing voltage differentials between the bitlines 14 and 16, higher performance memory devices are now requiring the ability to sense very small voltage differentials in the bitlines. By way of example, traditional sense amplifiers were previously required to sense voltage differentials of approximately 500 millivolts (mV) between the bitlines 14 and 16 in order to commence a reading of data that may be stored in a particular core cell 12. Due to expected fabrication imperfections and circuit layout constraints, there is usually a voltage offset between the bitlines 14 and 16. Commonly, voltage offsets are expected to be between about 5 to 30 millivolts.

Even though such offsets are expected and usual, these voltages offsets are quite insignificant compared to the 500 millivolt voltage differential required for triggering amplification by a sense amplifier. However, higher performance memory devices are now requiring that amplification by a sense amplifier occur at much faster rates and are therefore required to sense voltage differentials of between about 15 and 60 millivolts between the bitlines. Unfortunately, voltage offsets in the range of between about 5 and 30 millivolts will necessarily begin to hamper the speed at which sense amplification may occur.

FIG. 1B shows a pair of exemplary bitlines 14 and 16 that are interconnecting successive core cells 12 in the vertical column direction. Also shown are representative wordlines 18 that horizontally interconnect each of the core cells 12. As is well known, the core cells 12 are typically symmetric data latching circuits that have cross-coupled inverters and passgate transistors that are coupled to respective wordlines 18. Although the core cells 12 are symmetric in their schematic circuit representation, the resulting geometric shape and layout orientation on a semiconductor substrate will usually be less than perfectly symmetric.

As a result, the capacitive loading experienced on each of the respective bitlines 14 and 16 will not be equal. That is, when the voltage at point 32 is driven to a rail voltage (Vdd), capacitive coupling of $C_1$ will occur between pre-charged transistors 30 and the bitlines 14 and 16. As pictorially shown in FIG. 1B, if the capacitive loading in the bitline 14 is "C+$\Delta$C" and the capacitive loading in the complementary bitline 16 is "C," then there will be a voltage offset of $\Delta$V between bitlines 14 and 16 due to miller coupling capacitance. In other words, bitline 14 may have a voltage of V, and the complimentary bitline 16 may have a voltage of V+$\Delta$V. It is this voltage offset that becomes problematic when voltage sensing between the bitlines is required at lower voltage differentials. This problem occurs while reading a low on complementary bitline 16, when the complementary bitline 16 has a voltage of V+$\Delta$V.

For example, FIG. 1C shows bitline 14 and the complimentary bitline 16 graphed in terms of voltage and time, and illustrating that sense application will occur when accessing data of a particular core cell 12. In this example, the voltage offset is shown to be 15 milli-volts (mV) between the bitline 14 and the complimentary bitline 16. When sensing of digital data that is stored in a particular core cell occurs, the complimentary bitline 16 will begin to fall at a time $T_0$. Of course, the complimentary bitline 16 must first cross the bitline 14 at a time $T_1$. Therefore, higher performance sense amplifiers that are required to detect about 30 millivolt differences between the bitlines, and also have voltage offsets of 15 milli-volts (mV), will not commence their amplification until a time $T_3$.

As can be graphically appreciated, if there were no voltage offset between the bitlines as represented by a complimentary bitline 16', a sense amplifier would be able to sense a voltage differential of 30 millivolts much more rapidly at a time $T_2$. Consequently, even very small voltage offsets will have substantially increased performance deteriorating ramifications. Unfortunately, conventional memory device performance is limited by the expected fabrication imperfections and layout constraints that produce imbalances in capacitive loading of the bitlines of each core cell 12.

In addition to capacitive loading imbalances, several semiconductor layout constraints have prevented further miniaturization of the physical size of an individual core cell 12. Because traditional six transistor core cells have two cross-coupled inverters laid out in the center of a core cell, the gates of four transistors of the two cross-coupled inverters are formed from by interposing polysilicon lines. FIG. 1D shows the conventional layout of the polysilicon lines that form the gates of the four transistors in the two cross-coupled inverters.

Although this layout works well, the space needed to layout the polysilicon lines and complete the cross-coupling in polysilicon have severely limited the ability to reduce a core cell's overall size. In this conventional design, a core cell 12 will typically have a height "H" of about 3.2 microns and a width "W" of about 5.4 microns in a 0.25 micron process. Because six transistor core cells require four transistors (i.e., two N-type transistors and two P-type transistors for the two inverters) in a cross-coupled arrangement, it is very difficult to further shrink the size of a standard core cell 12.

In view of the foregoing, what is needed is a method and apparatus for substantially eliminating voltage offsets along bitlines of a memory device, and for improving the speed at which sensing of small voltage differentials between memory bitlines can occur. There is also a need for more compact core cell layouts that enable the layout of more core cells in substantially less semiconductor surface area.

SUMMARY OF THE INVENTION

Broadly speaking, the present invention fills these needs by providing memory layout techniques that substantially eliminate voltage offsets between memory core cell bitlines, as well as techniques for laying out core cells in substantially less semiconductor chip area. It should be appreciated that the present invention can be implemented in numerous ways, including as a process, an apparatus, a system, a device, or a method. Several embodiments of the present invention are described below.

In one embodiment, a method of designing a memory device that has reduced bitline voltage offsets is disclosed. The method includes providing a memory core having a depth that defines a plurality of words, and a word width that is defined by multiple pairs of a global bitline and a global complementary bitline. The method also includes designing a core cell having a bitline and a complementary bitline, and designing a flipped core cell that has a flipped bitline and a flipped complementary bitline. Further, the method includes arranging a core cell followed by a flipped core cell along each of the multiple pairs of the global bitline and the global complementary bitline. Preferably, the bitline of the core cell is coupled with the flipped complementary bitline of the flipped core cell, and the complementary bitline of the core cell is coupled to the flipped bitline of the flipped core cell.

In yet another embodiment, a memory device having equalized bitline capacitive coupling is disclosed. The memory device includes a memory core having a depth that defines a plurality of words, and a word width that is defined by multiple pairs of a global bitline and a global complementary bitline. The memory device further includes a core cell having a bitline and a complementary bitline, and a flipped core cell that has a flipped bitline and a flipped complementary bitline. The multiple pairs of the global bitline and the global complementary bitline have a plurality of core cells that are defined by alternating ones of the core cell and the flipped core.

In still another embodiment, a system using a memory generator for making a memory device that has reduced bitline voltage offsets is disclosed. The system includes an automated circuit generator for providing a memory core that has a depth that defines a plurality of words, and a word width that is defined by multiple pairs of a global bitline and a global complementary bitline. The system also includes an automated circuit generator for designing a core cell having a bitline and a complementary bitline, and an automated circuit generator for designing a flipped core cell that has a flipped bitline and a flipped complementary bitline. The system further includes an automated circuit generator for arranging a core cell followed by a flipped core cell along each of the multiple pairs of the global bitlines and the global complementary bitlines.

In still yet a further embodiment, a memory core circuit design is disclosed. The circuit design has a polysilicon design that is routed over a semiconductor substrate. The polysilicon design is configured to define six gates of a core cell, and the core cell has four transistors that define two cross-coupled inverters. The cross-coupled inverters are electrically cross-coupled by a portion of the polysilicon design, a portion of a metallization line that is routed on a first metallization line, and a portion of a metallization line that is routed on a second metallization layer. Wherein the multi-layer electrical cross-coupling substantially reduces a physical size of the core cell.

Advantageously, the various embodiments of the present invention provide methods and apparatus for substantially eliminating voltage offsets between bitlines, and also provides techniques for designing very compact core cell layouts in multilevel semiconductor devices. As a further advantage, compact core cells have reduced line capacitance, which will necessarily improve performance. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

An invention for memory layout techniques that substantially eliminate voltage offsets between memory core cell bitlines, and techniques for laying out core cells in substantially less semiconductor chip area are disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Although several embodiments of the present invention are directed toward asynchronous and synchronous SRAM memory devices, the capacitive load balancing and layout designs of the present invention may also be applicable to other memory devices, such as a ROM device, a RAM device, a DRAM device, an EPROM device, an EEPROM device, etc. For more information on memory devices, reference may be made to a book entitled "The Art of Electronics, $2^{nd}$ Edition," by Paul Horowitz and Winfield Hill, pages 812–820 (1996). This book is hereby incorporated by reference.

Figure 2A:
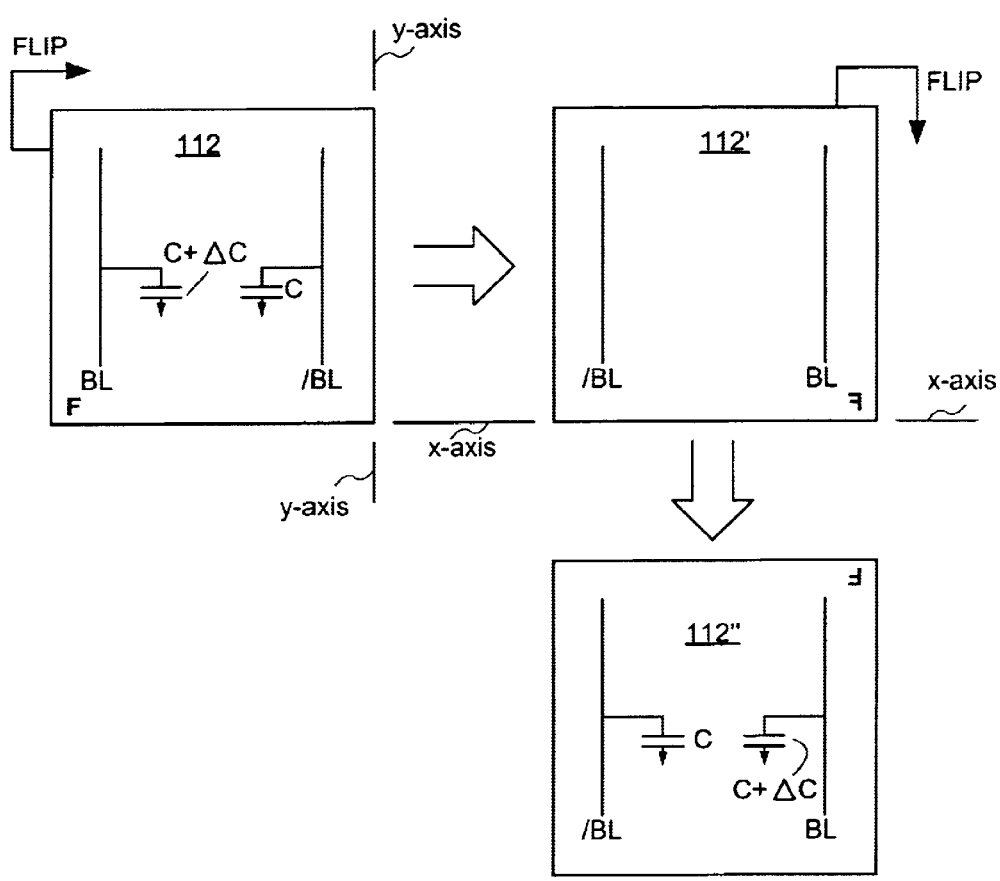
FIG. 2A is a block diagram illustrating the preferred layout manipulations performed on a core cell in accordance with one embodiment of the present invention.

FIG. 2A is a block diagram illustrating the preferred layout manipulations performed on a core cell 112 in accordance with one embodiment of the present invention. In an effort to eliminate voltage offsets between the bitline pairs in core cells 112, the layout orientation of the core cell 112 is manipulated to produce a new core cell 112", which can be aligned and paired up in sets of two with a non-manipulated core cell 112. By pairing up the core cell 112 with the core cell 112", it is possible to eliminate the capacitive inequalities between the bitlines. That is, the expected capacitive imbalance (i.e., that produces the voltage offset) of the core cell 112 will be equalized by the identical, but opposite, capacitive imbalance of the core cell 112".

For example, the core cell 112 will generally have a bitline (BL) and a complimentary bitline (/BL) that run vertically through each core cell 112 of a vertical column. To clearly illustrate the layout manipulations that are performed on a standard core cell 112, a letter "F" is depicted at a bottom leftmost corner of the core cell 112. At an initial step, the core cell 112 is flipped horizontally about a Y-axis, such that the bitline (BL) will now reside at the rightmost part of a core cell 112', and the complimentary bitline (/BL) will now reside at the leftmost part of the core cell 112'. After the flipping operation, the letter F will be transformed backwards, and will now reside in the lower right-hand corner of the core cell 112'.

Next, the core cell 112' is again flipped in a vertical direction about an X-axis to produce a core cell 112". As expected, the core cell 112" will remain with its bitline (BL) at the rightmost part of the core cell 112", and the complimentary bitline (/BL) at the leftmost part of the core cell 112". The letter F will now be depicted at the top right-hand corner of the core cell 112". As pictorially shown, because the core cell 112" is an exact replica of the core cell 112 (i.e., a flipped core cell), the capacitive imbalance of the core cell 112 will be the same as in the core cell 112", however, the imbalance will now be reversed.

It should be understood that the cross-coupled inverters and the passgate transistors of a standard six transistor core cell are symmetric in orientation and in operation. Therefore, when the core cells are aligned along a particular column of bitline pairs, the core cell 112 and the core cell 112" will be aligned in an alternating sequence, one after the other so that the capacitive imbalance on the global bitlines is exactly equal. Therefore, the voltage offset due to capacitive imbalance on the bitline pair will be eliminated.

Figure 2B:
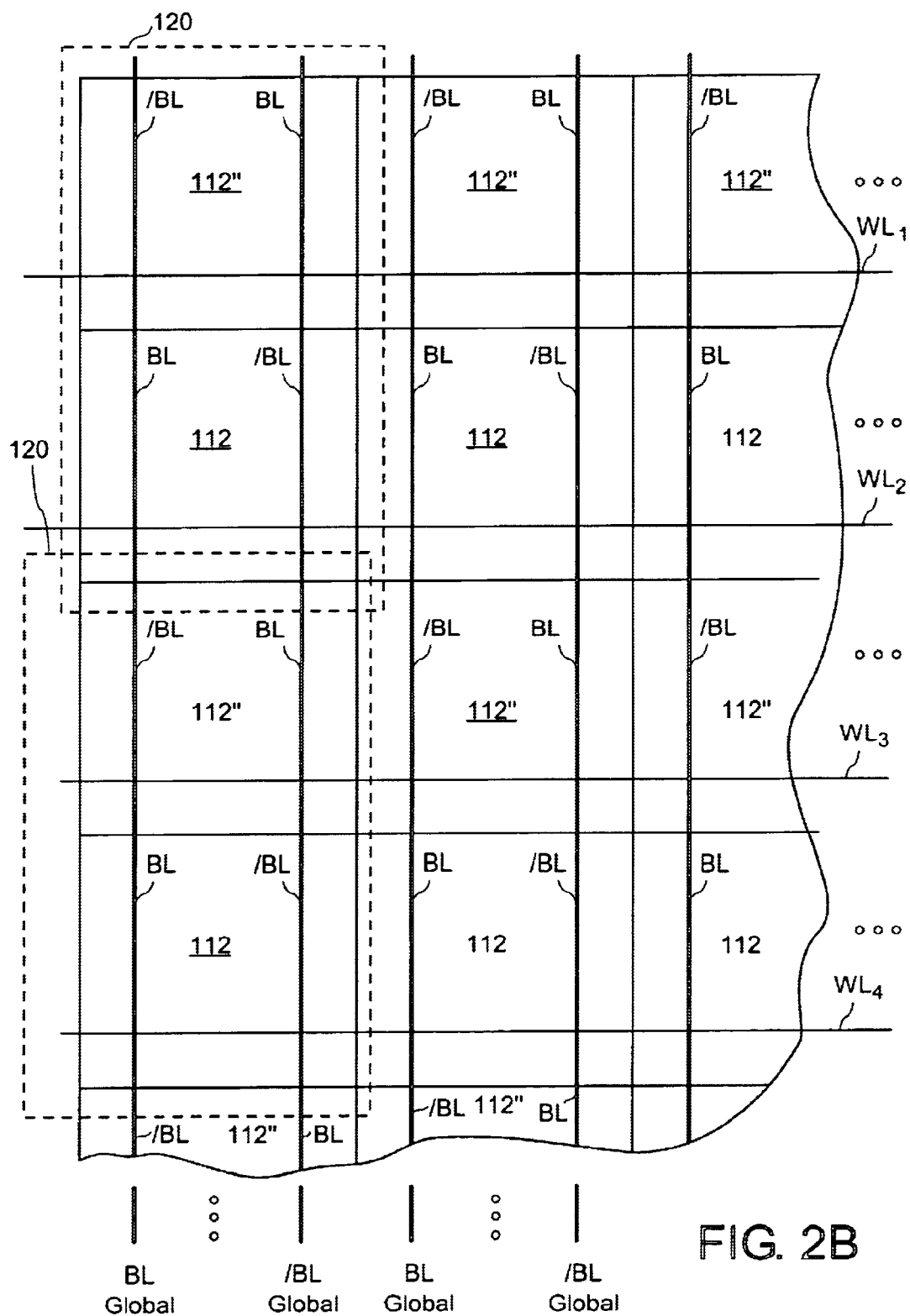
FIG. 2B shows a partial diagram of a memory core that has a plurality of paired core cells in accordance with one embodiment of the present invention.

FIG. 2B shows a partial diagram of a memory core that has a plurality of paired core cells 112 and 112" in accordance with one embodiment of the present invention. In this example, the internal bitlines (BL) and complimentary bitlines (/BL) of the individual core cells 112 and 112" will be interconnected in an alternating manner. Thus, the global bitlines (GBL and /GBL) will actually be composed of sub-bitlines (BL) and subcomplimentary bitlines (/BL) of each respective core cell 112 and 112". It should therefore be understood that the reading and writing operations of a selected core cell will function with respect to the orientation of the global bitlines, and without regard to the label that may be applied to the internal bitlines of each core cell 112 and 112".

In this manner, the fabrication imperfections and layout constraints that cause capacitive imbalance between the bitlines will be equalized by the opposite fabrication imperfections and layout constraints of the next core cell in a given column. By way of example, pairs of core cells 120 are shown to include a core cell 112 and a core cell 112", which advantageously equal each core cell's respective capacitive imbalance. In typical memory core applications, a memory core will have an even number of core cells aligned along a given column, which necessarily enables perfect pairs of core cells 112 and 112" to be aligned along the global bitline of a memory core's columns.

However, if an odd number of core cells are laid out in a particular memory core application, the voltage offset in the global bitlines and complimentary global bitlines will be minimal because the offset will only be that of the last core cell. That is, all pairs of core cells will be matched (i.e., producing equal capacitance) until the last odd core cell can no longer be matched. However, the voltage offset of one core cell in a column of hundreds of core cells will usually be quite insignificant.

For example, if there are 1,024 core cells aligned along a particular pair of global bitlines, then pairs of core cells 112 and 112" may be successively arranged to eliminate all of the voltage offsets between the bitlines. However, if there are 1,025 core cells, only the offset of one cell will remain. In most applications, the offset of a single core cell will usually not impact high performance memory devices, which is essentially equal to low noise.

Figure 2C:
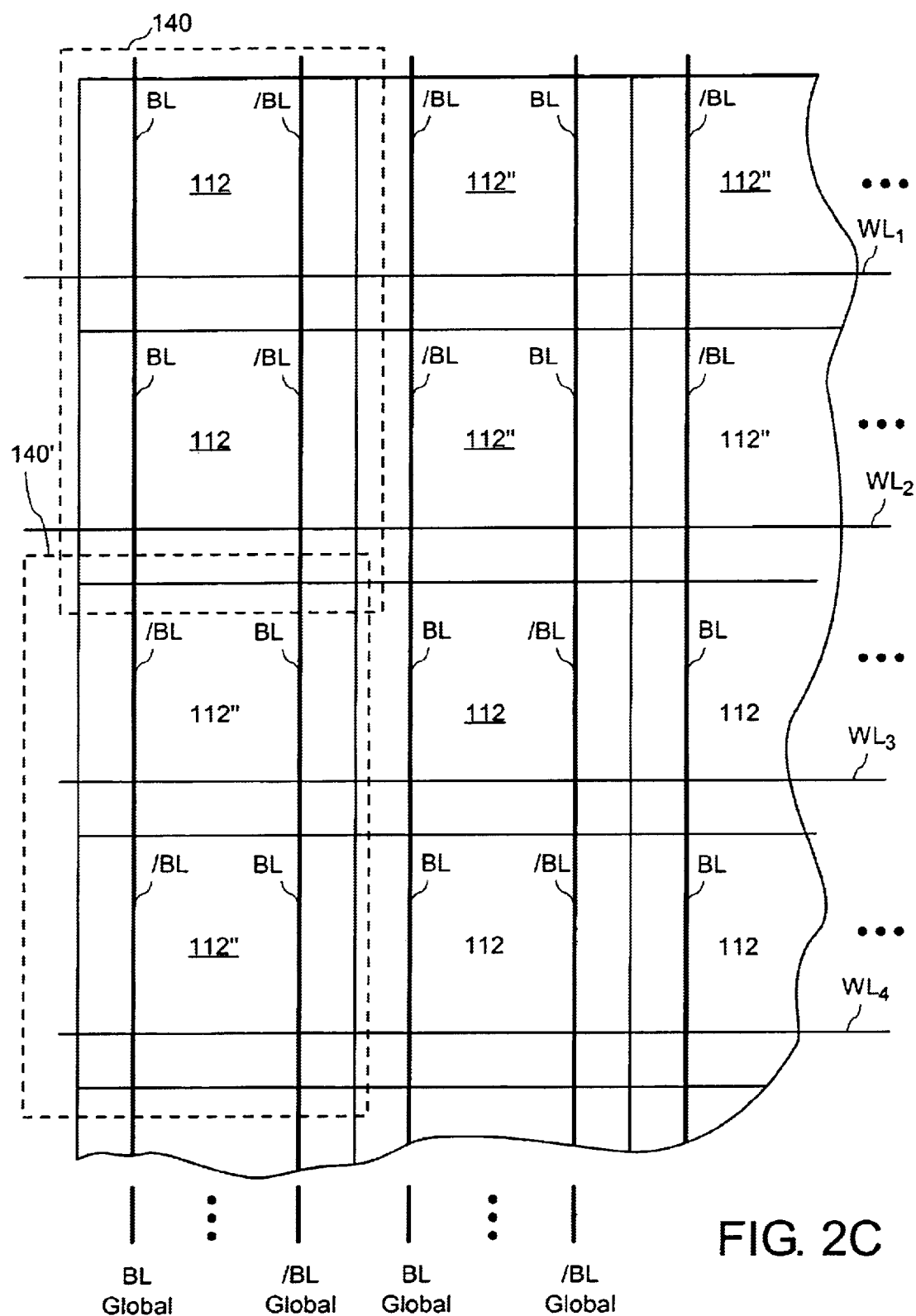
FIG. 2C shows another embodiment in which an equal number of capacitance equalizing core cells are arranged along a column in accordance with one embodiment of the present invention.
Figure 3A:
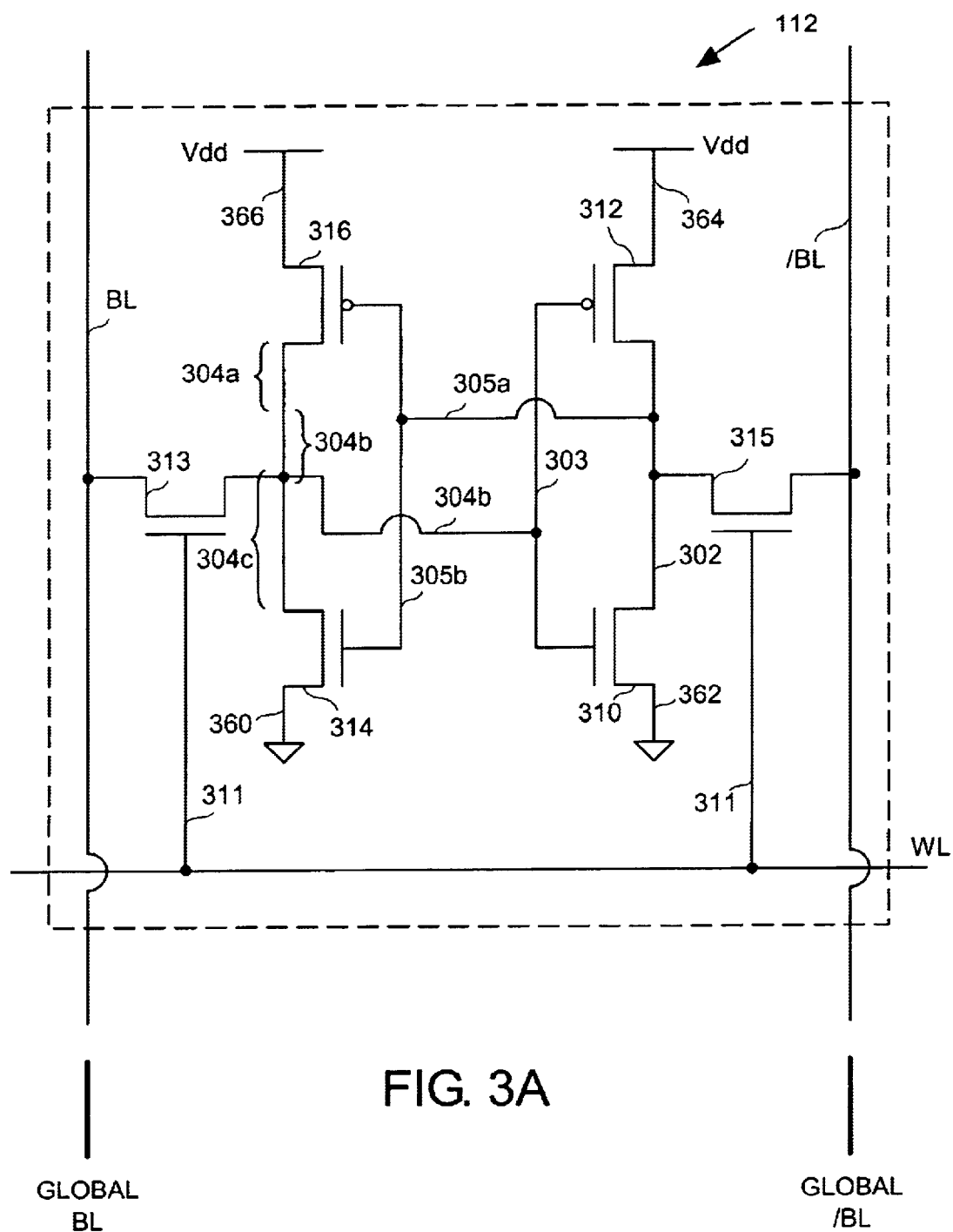
FIG. 3A shows an exemplary six transistor core cell in accordance with one embodiment of the present invention.

FIG. 2C shows another embodiment in which an equal number of core cells 112 and core cells 112" are arranged along a column. However, in this example, the core cells 112 and 112" do not necessarily have to be arranged one after another. In fact, so long as there is an equal number of core cells 112 and 112" arranged along a particular column, the capacitance imbalances for that column will be eliminated. As such, the capacitive imbalance of the pair of core cells 112 that are shown in 140 will be equalized by the pair of core cells 112" of 140'. Of course, FIG. 2C illustrates only one possibility of offsetting capacitive imbalances provided by the core cells 112 and 112", and other arrangements will also work so long as the additive capacitive imbalances of core cells 112 are offset by the additive capacitive imbalances of core cells 112". FIG. 3A shows an exemplary six transistor core cell 112 in accordance with one embodiment of the present invention. Core cell 112 is a standard six transistor core cell having cross-coupled inverters defined by transistors 310, 312, 314, and 316. In addition, a pair of passgate transistors 313 and 315 are shown having their gates coupled to a wordline, that is used to access a particular row of core cells 112. Passgate transistors 313 and 315 are also respectively coupled between the bitline (BL) and the complimentary bitline (/BL).

As mentioned above, because this standard core cell is symmetric, the flipping of the core cell 112 to produce core cell 112″ will not change the data latching ability of the circuit. Accordingly, the operability of the core cell 112″ will be functionally the same as that of core cell 112 when data is either written in or read out by accessing the global bitlines (GBL) and the global complimentary bitlines (/GBL).

Figure 3B:
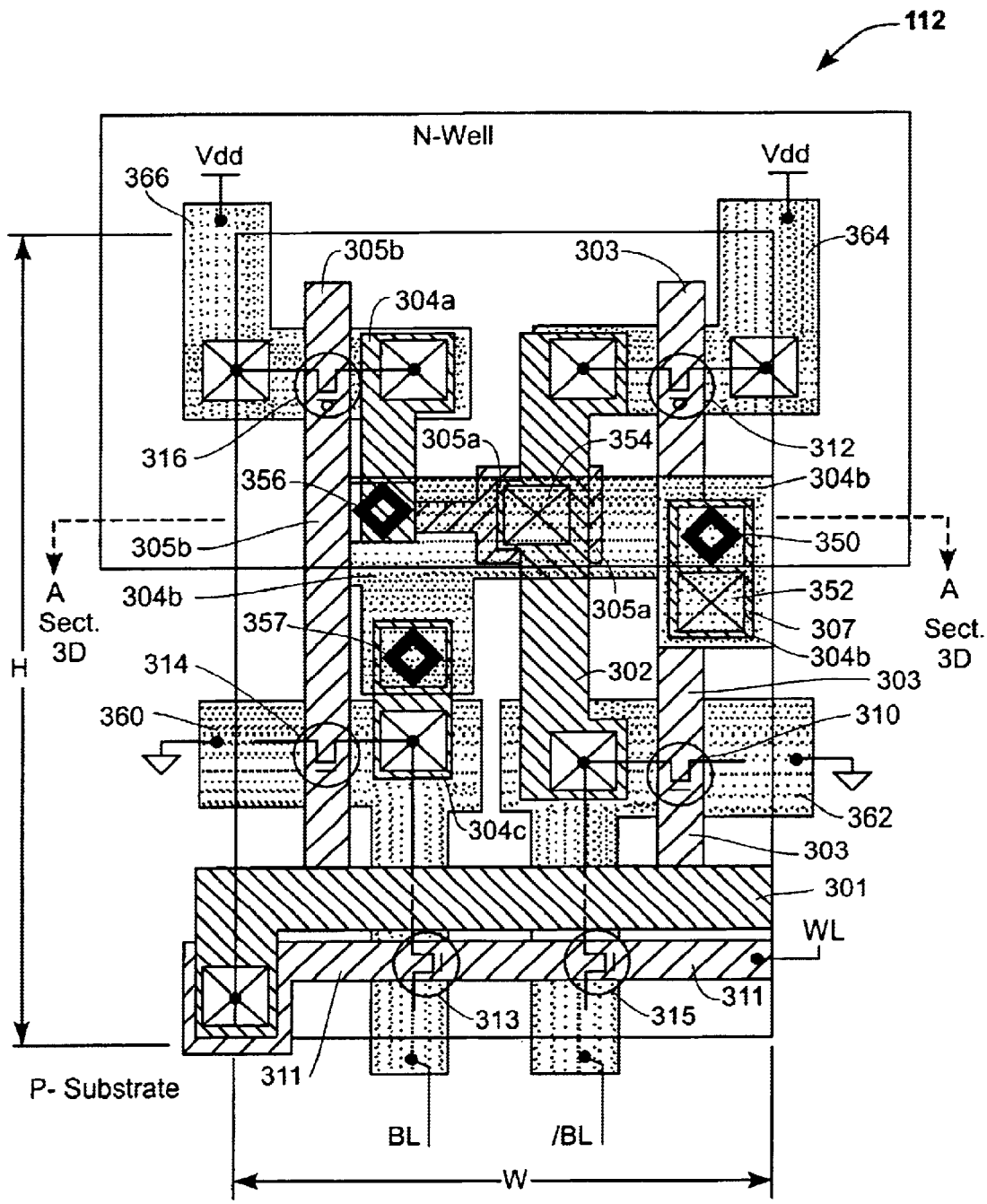
FIG. 3B shows a layout diagram of the six transistor core cell in accordance with one embodiment of the present invention.

FIG. 3B shows a circuit diagram of the core cell 112 once it has been fabricated on a semiconductor substrate in accordance with one embodiment of the present invention. Of course, it should be understood that the layout geometries of the core cell 112 of FIG. 3B are in fact representative layout geometries that are ultimately transferred to a number of reticle masks, which are implemented in photolithography and etching operations. Thus, the core cell 112 is depicted as a number of geometric layers, which are arranged to create a core cell that has a width "W" and a height "H" once it is fabricated onto a semiconductor substrate. The semiconductor substrate is preferably an P-type substrate that has a N-well in which transistors 312 and 316 are formed.

For example, the transistors 310, 313, 314, and 315 are formed by gates that are part of polysilicon lines 303, 305b and 311. The gates of the P-type transistors 312 and 316 are formed by the polysilicon lines 303 and 305b. For the N-type transistors, N-type diffusion regions 360, and 362 are formed in the substrate of the core cell 112. Respective P-type diffusion regions 364 and 366 are also implanted and diffused into the N-type well to form the P-type transistors 312 and 316. Once the polysilicon lines 303, 305a, 305b, and 311 have been formed over the substrate using well known photolithography and etching operations, a level of oxide material is deposited over the core cell 112.

For simplicity, the oxide material will not be shown by this top level view, however, FIG. 3D below shows the respective positioning of the oxide material. In a first metallization layer, interconnecting metal lines 301, 302, 304a, 304c, and 307 are patterned over certain electrical contacts that make a connection down to selected diffusion regions and gates. Once the first metallization has been patterned, another layer of intermetal oxide is deposited before a second level of metallization is deposited and patterned. In the second metallization layer, a metallization line 304b is formed to provide electrical interconnection to the underlying first metallization layer through conductive vias 350, 356, and 357.

Figure 1A:
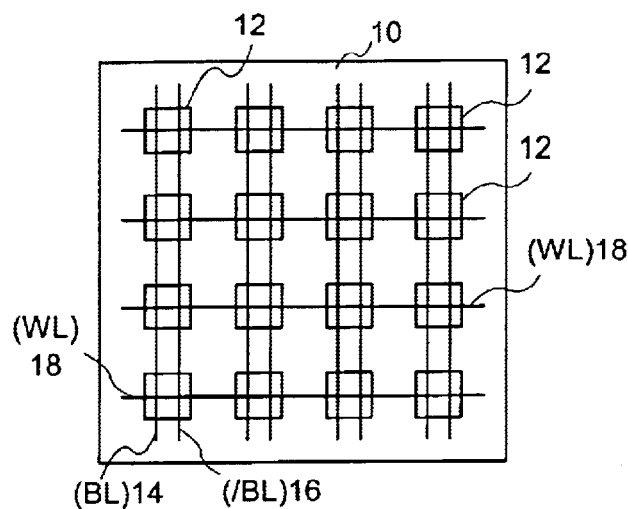
FIG. 1A shows a simplified diagram of a memory core that has an array of core cells.
Figure 1B:
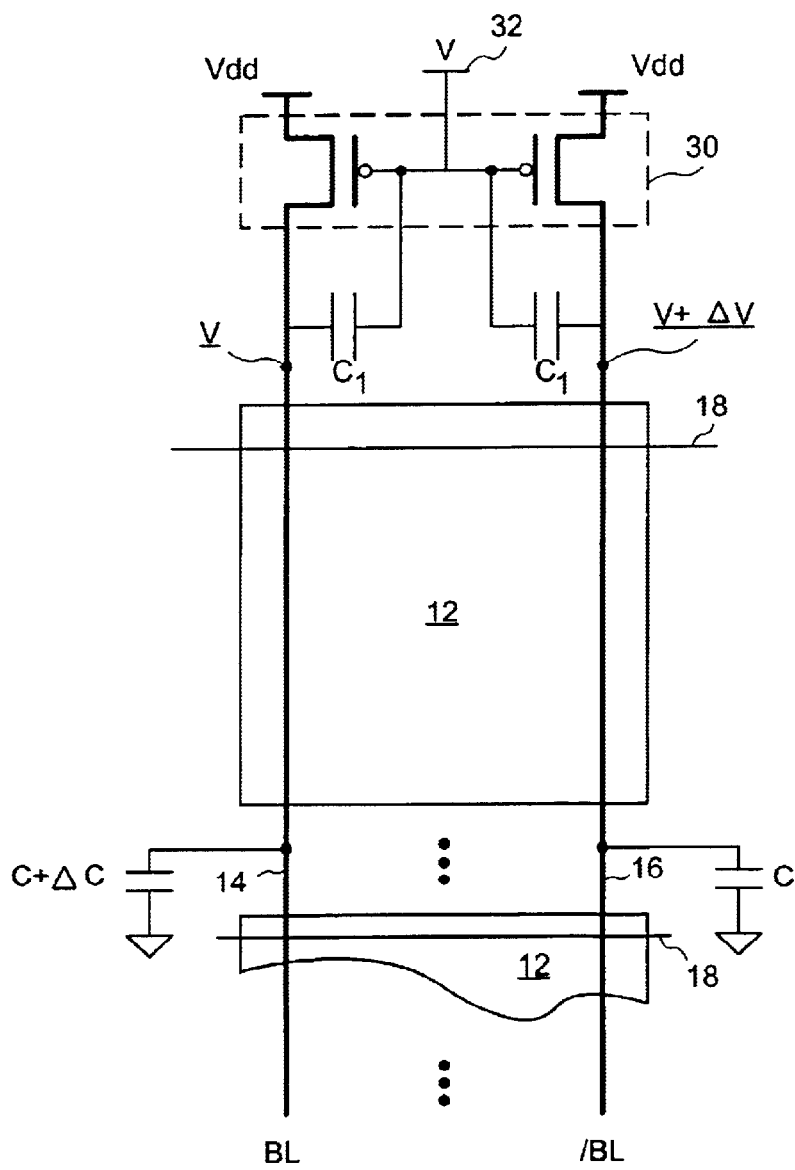
FIG. 1B shows a pair of exemplary bitlines that are interconnecting successive core cells in a vertical column direction.
Figure 1C:
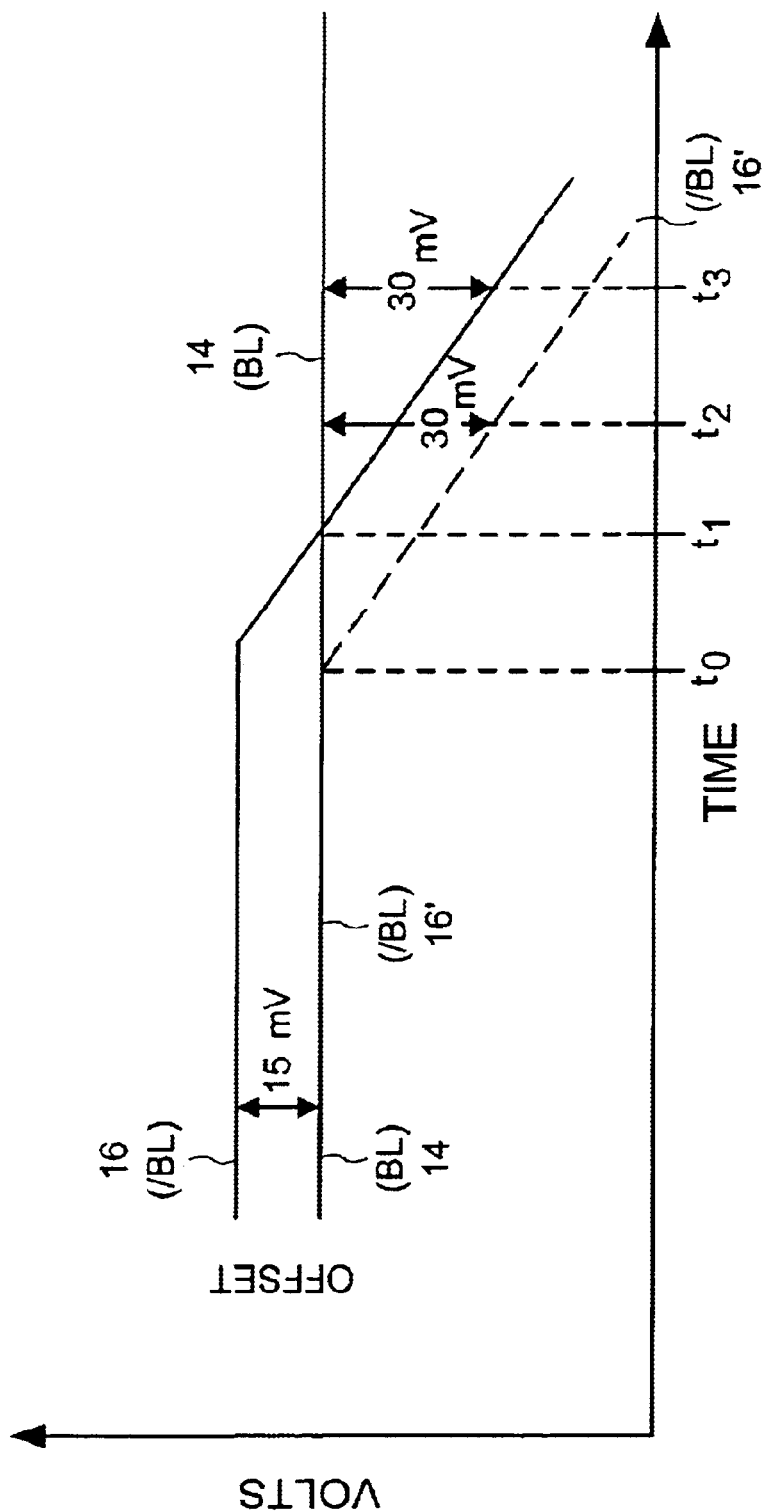
FIG. 1C shows a bitline and a complimentary bitline graphed in terms of voltage and time, and illustrating the transitions during a sense application operation.
Figure 1D:
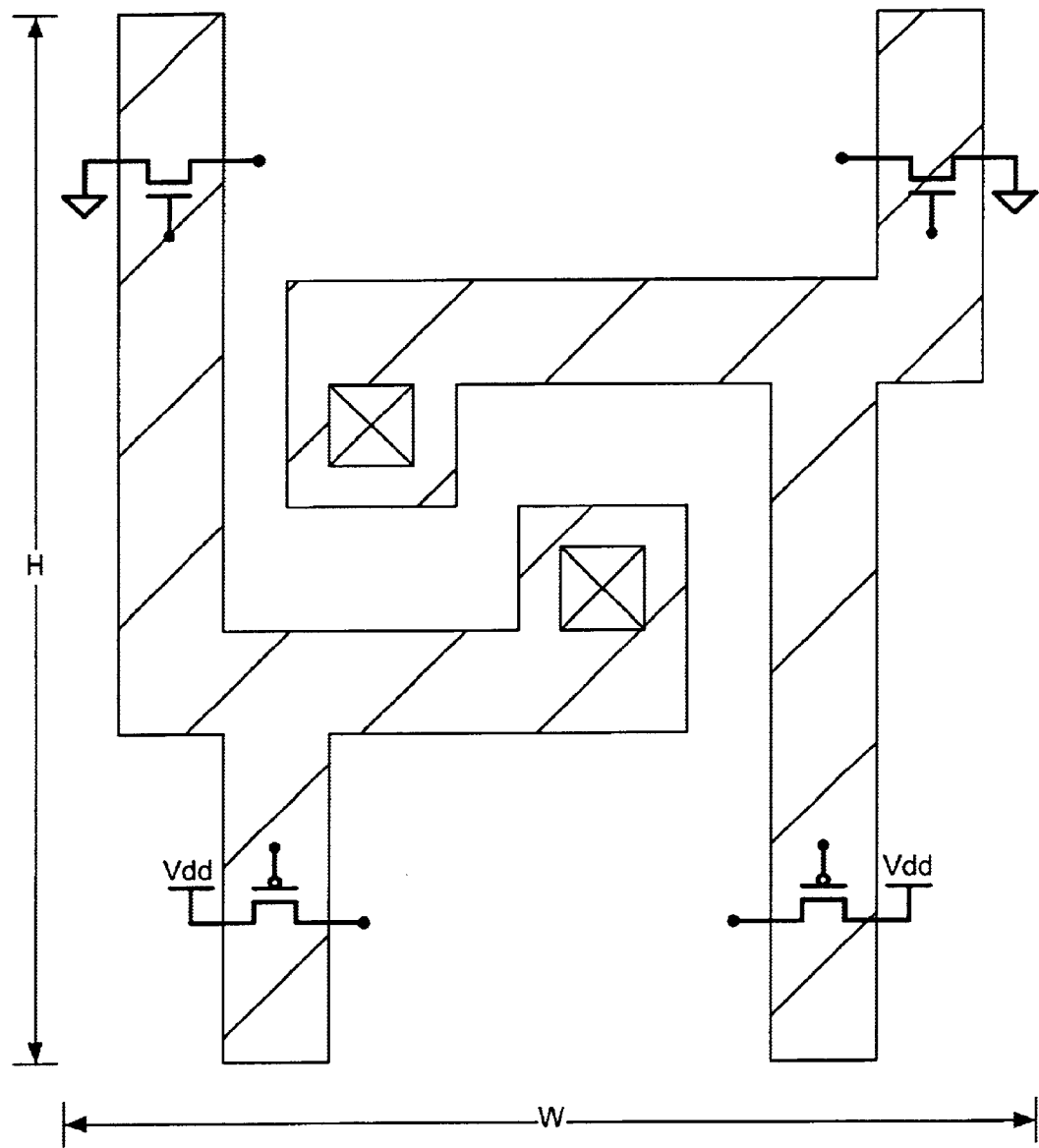
FIG. 1D illustrates a standard polysilicon layout of the 4 cross-coupled transistors of a six transistor core cell, and the excess surface space that is needed to complete cross-coupling in polysilicon.
Figure 3C:
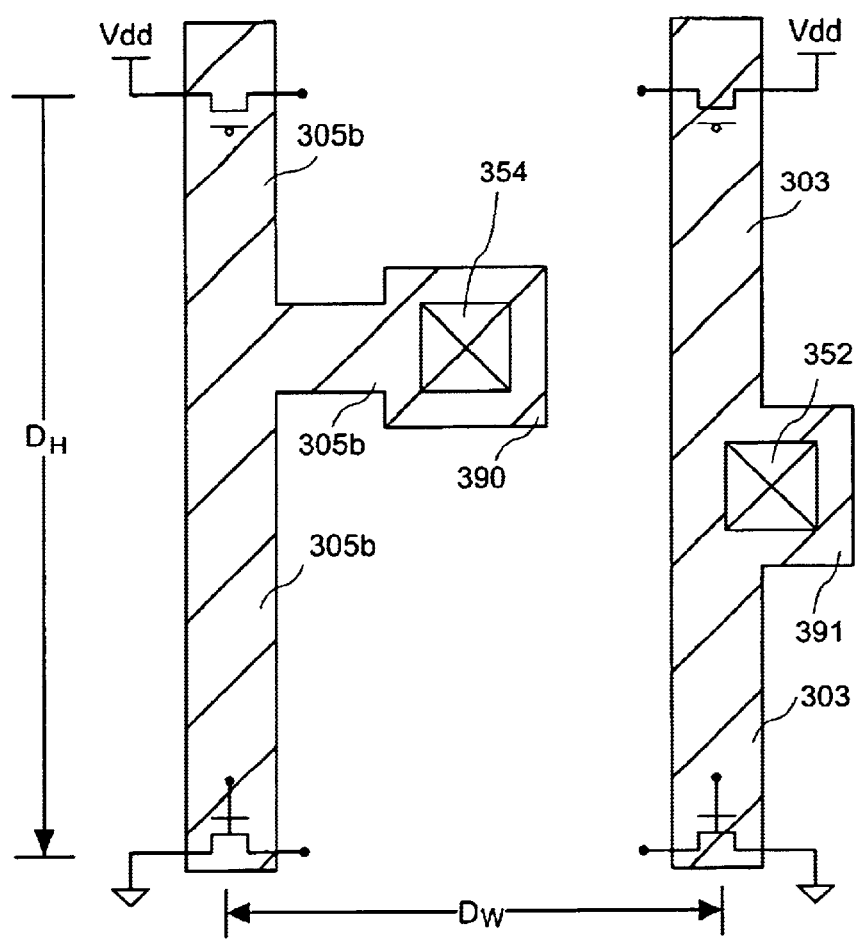
FIG. 3C is a more detailed view of the compact polysilicon layout of FIG. 3B in accordance with one embodiment of the present invention.

A particularly advantageous feature of this design is the compact layout of the underlying polysilicon lines and the ability to complete required electrical cross-coupling with the second metallization layer (i.e., also referred to as a "metal-2 jumper"). As compared to the prior art layout of the polysilicon lines of FIG. 1D, the layout of polysilicon lines 305a, 305b and 303 as shown in FIG. 3C, enable circuit layout in substantially less substrate area. Specifically, the polysilicon layout design that is shown in FIG. 3C strategically has designed polysilicon contact heads (i.e., 390 and 391) that are facing the same direction (i.e., the direction that is perpendicular to a column direction). In addition, electrical contact is made from the polysilicon contact head 391 to the second metallization layer 304b (e.g., as shown in FIGS. 3B and 3D) to complete the necessary cross-coupling connections. As a result, many more core cells 112 can be laid out in less substrate area.

As shown in more detail in FIG. 3C, the polysilicon lines 305a that are patterned to provide electrical contact through a conductive contact 354 to the first metallization line 307 and the second metallization line 304b, may be placed in closer proximity to the polysilicon line 303. This is because less polysilicon routing is used to complete the cross-coupling for the cross-coupled inverter circuitry of core cell 112, and same direction polysilicon contact heads 390 and 391 are used.

Furthermore, the unique use of the second metallization line 304b (i.e., a metal-2 jumper) enables the design of a more compact core cell, which in turn allows more core cells to be packed into less substrate area. For comparison purposes, the typical six-transistor core cell of FIG. 1D has a core cell width "W" of 5.4 microns and a height "H" of 3.2 microns.

Figure 3D:
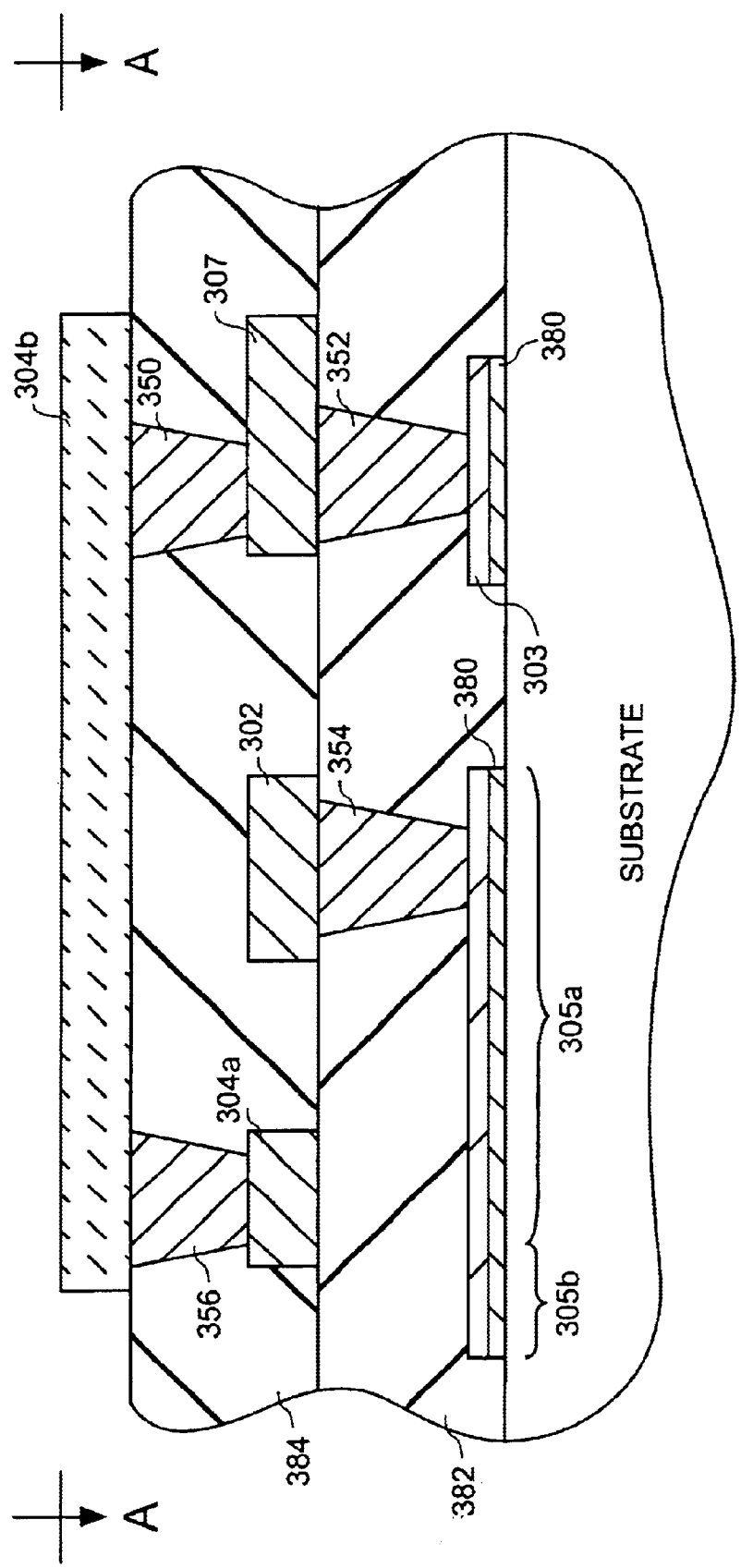
FIG. 3D shows a cross-sectional view across axes A—A of FIG. 3B, which illustrates the electrical interconnections in accordance with one embodiment of the present invention.

By implementing the polysilicon design of FIG. 3C and the multi-layer interconnections of FIG. 3D, it is possible to substantially reduce the size of the six transistor cell. In one embodiment, the core cell may be about 2.5 microns in width and about 3.5 microns in height. In yet another embodiment, the core cell may also be about 3.0 microns in width and about 4.9 microns in height. Further, in this exemplary cell size, the distance between the P-type transistors 312 and 316 (i.e., Dw), and between the N-type transistors 310 and 314 (i.e., $D_w$) can be reduced to a distance of about 1.6 microns. In the vertical direction, the distance between the P-type transistors and the N-type transistors (i.e., $D_H$) can be reduced to about 1.6 microns. In these examples, the distances are measured between their respective gates (i.e., center points of the transistor gates). Of course, this compact layout design can be enlarged or reduced to larger or smaller area spaces, so long as the same compact and advantageous structural layout designs are maintained.

FIG. 3D shows a cross-sectional view across axes A—A of FIG. 3B, which illustrates the electrical interconnections in accordance with one embodiment of the present invention. As shown, the polysilicon lines 303, 305a, and 305b are patterned over a gate oxide 380 that lies over the substrate surface. An oxide layer 382 is then deposited over the polysilicon lines and surface of the substrate. Conductive contacts 352 and 354 are then formed in the oxide layer 382 to make electrical contact down to the polysilicon lines.

Next, the oxide layer is planarized and a metallization layer is deposited and patterned. The patterned metallization layer therefore produces features 302, 304a, and 307, which are shown in FIG. 3B. A second oxide layer 384 is then deposited over the patterned metallization, and then conductive vias 350 and 356 are formed in the oxide 384. The oxide 384 is then planarized before a second metallization layer is deposited and patterned over the surface of the dielectric layer 384. The second metallization layer therefore forms at least feature 304b that is used for the cross-coupling of the inverters in FIG. 3A.

For more information on memory sense amplifiers and associated memory output buffers, reference may be made to commonly assigned U.S. patent applications entitled: (1) "Sense Amplifying Methods and Sense Amplification Integrated Circuit Devices," having Ser. No. 08/797,347, and filed on Feb. 11, 1997; (2) "High Speed Memory Output Circuitry And Methods for Implementing Same," having Ser. No. 08/806,335, and filed on Feb. 26, 1997; (3) "High Speed Addressing Buffer and Methods For Implementing Same," having Ser. No. 08/837,611, and filed on Apr. 21, 1997; and (4) "Voltage Sense Amplifier and Methods For Implementing the Same," having Ser. No. 08/839,151, and filed on Apr. 23, 1997. All above identified U.S. patent applications are incorporated by reference herein.

Although the foregoing invention has been described in some detail for purposes of clarity of understanding, it will be apparent that certain changes and modifications may be practiced within the scope of the appended claims. It should therefore be understood that the various circuit diagrams may be embodied in any form which may include, for example, any suitable semiconductor substrate, printed circuit board, packaged integrated circuit, or software implementation. In software implementations, a memory generator, which is a software design program, enables the design of memory devices having desired characteristics and functionalities.

Accordingly, the present embodiments are to be considered as illustrative and not restrictive, and the invention is not to be limited to the details given herein, but may be modified within the scope and equivalents of the appended claims.

What is claimed is:

1. A memory device having equalized bitline capacitance; comprising:
 a memory core having a depth that defines a plurality of words, and a word width that is defined by multiple pairs of a global bitline and a global complementary bitline;
 a core cell having a bitline and a complementary bitline;
 a flipped core cell that has a flipped bitline and a flipped complementary bitline, the multiple pairs of the global bitline and the global complementary bitline have a plurality of core cells that are defined by alternating ones of the core cell and the flipped core.

2. A memory device having equalized bitline capacitance as recited in claim 1, wherein the bitline of the core cell is coupled with the flipped complementary bitline of the flipped core cell, and the complementary bitline of the core cell is coupled to the flipped bitline of the flipped core cell.

3. A memory device having equalized bitline capacitance as recited in claim 2, wherein successive pairs of the core cell and the flipped core cell are aligned along each of the multiple pairs of the global bitline and the global complementary bitline.

4. A memory device having equalized bitline capacitance as recited in claim 3, wherein the core cell and the flipped core cell have an identical pair of cross-coupled inverters.

5. A memory device having equalized bitline capacitance as recited in claim 4, wherein each of the identical pair of cross-coupled inverters includes two P-type transistors and two N-type transistors.

6. A memory device having equalized bitline capacitance as recited in claim 4, wherein each of the core cell and the flipped core cell have a pair of passgate transistors that are coupled to a respective one of the plurality of words.

7. A memory device having equalized bitline capacitance as recited in claim 1, wherein the memory device is laid-out on multiple layers of a semiconductor device.

8. A memory device having equalized bitline capacitance as recited in claim 7, wherein the core cell and the flipped core cell have cross-coupled inverters that include four transistors, the four transistors have gates that are laid out in polysilicon and cross-coupling connections that are at least partially connected through a multi-layer Interconnect structure.

9. A memory device having equalized bitline capacitance as recited in claim 8, wherein when the cross-coupling connections are at least partially connected through a multi-layer interconnect structure, the core cell and the flipped core cell layout sizes are substantially reduced.

10. A memory device having equalized bitline capacitance as recited in claim 1, further comprising:
 a memory generator for designing the memory device.

11. A memory device comprising:
 a memory core having a depth that defines a plurality of words, and a word width that is defined by multiple pairs of a global bitline and a global complementary bitline;
 a core cell having a bitline and a complementary bitline;
 a flipped core cell that has a flipped bitline and a flipped complementary bitline; and
 a plurality of the core cell in a column and a plurality of the flipped core cell are arranged in the column, such that the plurality of the core cell equals the plurality of the flipped core cell.

* * * * *